(12) United States Patent
Ham et al.

(10) Patent No.: US 9,907,182 B2
(45) Date of Patent: Feb. 27, 2018

(54) METHOD OF MANUFACTURING INSULATION FILM AND PRINTED CIRCUIT BOARD

(71) Applicant: Samsung Electro-Mechanic Co., Ltd., Suwon-si (KR)

(72) Inventors: Ho-Hyung Ham, Goyang-si (KR); Hwa-Young Lee, Suwon-si (KR); Jae-Kul Lee, Sejong (KR); Ok-Seon Yoon, Gwangmyeong-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 115 days.

(21) Appl. No.: 15/065,383

(22) Filed: Mar. 9, 2016

(65) Prior Publication Data
US 2017/0086303 A1    Mar. 23, 2017

(30) Foreign Application Priority Data

Sep. 17, 2015   (KR) .................... 10-2015-0131851

(51) Int. Cl.
| | |
|---|---|
| C09J 5/00 | (2006.01) |
| B29C 65/48 | (2006.01) |
| B32B 37/14 | (2006.01) |
| B32B 37/16 | (2006.01) |
| B32B 38/16 | (2006.01) |
| C08J 5/18 | (2006.01) |
| H05K 3/10 | (2006.01) |
| H05K 3/28 | (2006.01) |
| B32B 38/10 | (2006.01) |
| B32B 37/15 | (2006.01) |
| B32B 37/10 | (2006.01) |

(52) U.S. Cl.
CPC ............ *H05K 3/10* (2013.01); *B32B 37/15* (2013.01); *B32B 38/10* (2013.01); *H05K 3/28* (2013.01); *B32B 37/1018* (2013.01); *B32B 2307/206* (2013.01); *B32B 2311/00* (2013.01); *B32B 2457/08* (2013.01); *H05K 2203/06* (2013.01); *H05K 2203/12* (2013.01)

(58) Field of Classification Search
USPC ...... 156/247, 249, 289, 306.6, 306.9, 307.1, 156/307.3, 307.5, 307.7
See application file for complete search history.

(56) References Cited

U.S. PATENT DOCUMENTS

| | | | | |
|---|---|---|---|---|
| 4,339,485 A | * | 7/1982 | Shibano | ............... C09J 7/046 156/289 |
| 2009/0273073 A1 | * | 11/2009 | Tachibana | ............. H01L 21/563 257/692 |

FOREIGN PATENT DOCUMENTS

KR   10-2015-0024154 A   3/2015

OTHER PUBLICATIONS

Machine translation of KR 10-2015-0024154 (Year: 2017).*

* cited by examiner

*Primary Examiner* — Sing P Chan
(74) *Attorney, Agent, or Firm* — NSIP Law

(57) ABSTRACT

A method of manufacturing an insulation film includes: coating a resin composite on a lower protective film, the resin composite including an inorganic filler dispersed therein; forming an insulating layer by drying the resin composite such that the inorganic filler is precipitated in the coated resin composite; and laminating an upper protective film on the insulating layer.

15 Claims, 3 Drawing Sheets

METHOD OF MANUFACTURING INSULATION FILM AND PRINTED CIRCUIT BOARD

CROSS-REFERENCE TO RELATED APPLICATION(S)

This application claims the benefit under 35 USC 119(a) of Korean Patent Application No. 10-2015-0131851 filed on Sep. 17, 2015 in the Korean Intellectual Property Office, the entire disclosure of which is incorporated herein by reference for all purposes.

BACKGROUND

1. Field

The following description relates to methods of manufacturing an insulation film and a printed circuit board.

2. Description of Related Art

In step with digital products that have become increasingly smaller and multi-functional, functions of cutting-edge parts have become greatly upgraded. In order to cope with stringent specifications, there have been efforts to develop printed circuit boards that are thinner and have more highly integrated and finer circuits. Moreover, there have been vigorous efforts to produce a fine circuit by developing a composition having an increased inorganic filler content in order to allow a coefficient of thermal expansion of a metal layer to be similar to a coefficient of thermal expansion of an insulating layer.

An example of a printed circuit board including an insulating film having an inorganic filler in an insulating layer is described in Korean Patent Publication No. 10-2015-0024154 (laid open on Mar. 6, 2015).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a method of manufacturing an insulation film includes: coating a resin composite on a lower protective film, the resin composite including an inorganic filler dispersed therein; forming an insulating layer by drying the resin composite such that the inorganic filler is precipitated in the coated resin composite; and laminating an upper protective film on the insulating layer.

The insulating layer may include a resin rich layer and an inorganic filler precipitated layer. The insulating layer may have a concentration gradient of a content of the inorganic filler that increases from the resin rich layer toward the inorganic filler precipitated layer.

The concentration gradient of the content of the inorganic filler may increase continuously from the resin rich layer toward the inorganic filler precipitated layer.

A viscosity of the resin composite may be about 100 Pa·s or less.

A thickness of the insulating layer may be about 10 µm to about 40 µm.

A thickness of the resin rich layer may be about 10 µm or less.

The forming of the insulating layer may include forming the insulating layer without a primer layer.

According to another general aspect, a method of manufacturing a printed circuit board includes: coating a resin composite on a lower protective film, the resin composite including an inorganic filler dispersed therein; forming an insulating layer by drying the coated resin composite such that the inorganic filler is precipitated in the coated resin composite; laminating an upper protective film on the insulating layer; removing the lower protective film from the insulating layer; and laminating the insulating layer, from which the lower protective film is removed, on a base material comprising a circuit pattern.

The insulating layer may include a resin rich layer and an inorganic filler precipitated layer. The insulating layer may have a concentration gradient of a content of the inorganic filler that increases from the resin rich layer toward the inorganic filler precipitated layer.

The concentration gradient of the content of the inorganic filler may increase continuously from the resin rich layer toward the inorganic filler precipitated layer.

A viscosity of the resin composite may be about 100 Pa·s or less.

The method may further include thermo-compression bonding the insulating layer and the base material.

The method may further include: removing the upper protective film from the insulating layer; and forming a metal layer on a surface of the insulating layer from which the upper protective film is removed.

The forming of the metal layer may include forming the metal layer without forming a primer layer to adhere the insulating layer to the metal layer.

An adhesive strength of the lower protective film may be smaller than an adhesive strength of the upper protective film.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
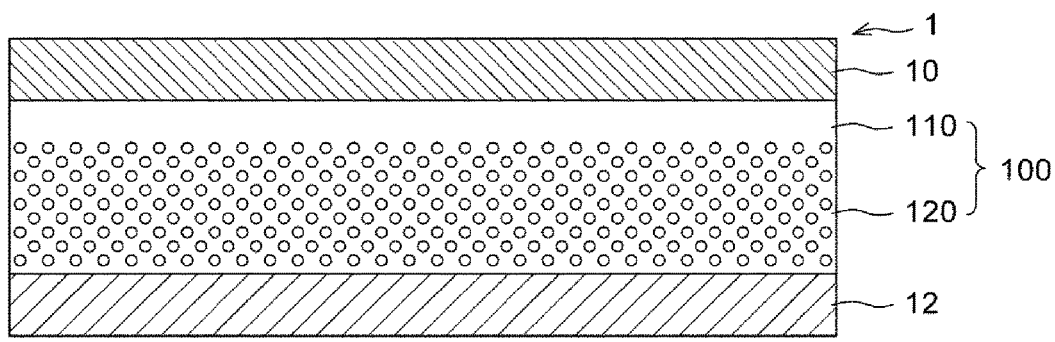
FIG. 1 is a cross-sectional view illustrating an example of an insulation film.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

FIG. 1 is a cross-sectional view illustrating an example of an insulation film 1.

Referring to FIG. 1, the insulation film 1 includes an upper protective film 10, an insulating layer 100 and a lower protective film 12. The insulating layer 100 includes a resin rich layer 110 and an inorganic filler precipitated layer 120.

The upper protective film 10 and the lower protective film 12 may be made of, for example, polyethylene terephthalate (PET), polyimide (PI), polypropylene (PP), polyethylene (PE) or the like. However, the upper protective film 10 and the lower protective film 12 are not limited to being made of the aforementioned materials. When the insulation film 1 is to be laminated on a base material having a circuit pattern formed thereon, the lower protective film 12 is removed. When a plating layer is to be formed on the resin rich layer 110, the upper protective film 10 is removed.

The insulating layer 100 is made of a resin composite having an inorganic filler dispersed therein. The resin composite may, for example, include an epoxy resin, a hardener and a hardening accelerator.

The epoxy resin may include, for example, naphthalene epoxy resin, bisphenol A type epoxy resin, bisphenol F type epoxy resin, novolak epoxy resin, cresol novolak epoxy resin, rubber modified epoxy resin, ring-type aliphatic epoxy resin, silicon epoxy resin, nitrogen epoxy resin or phosphor epoxy resin, but is not limited to including these materials.

The hardener includes a reactor that is capable of reacting with an epoxide ring included in the epoxy resin. The hardener may include, for example, aliphatic/aromatic amine-based hardener, ring-type aliphatic amine and derivative hardener, anhydride-based hardener, polyimide amine-based hardener, polysulfide hardener, phenolic hardener, bisphenol A type hardener, or dicyandiamide hardener, but is not limited to including these materials. The hardener may be used by itself or in combination with one or more other hardeners.

The hardening accelerator may be, but is not limited to, for example, a tertiary amine, an imidazolium, or a urea. The hardening accelerator may be used by itself or in combination with one or more other hardeners.

The inorganic filler may include, for example, at least one of silica (SiO2), alumina (Al2O3), silicon carbide (SiC), barium sulfate (BaSO4), talc, clay, mica powder, aluminum hydroxide (AlOH3), magnesium hydroxide (Mg(OH)2), calcium carbonate (CaCO3), magnesium carbonate (MgCO3), magnesium oxide (MgO), boron nitride (BN), aluminum borate (AlBO3), barium titanate (BaTiO3) and calcium zirconate (CaZrO3). However, the inorganic filler is not limited to the aforementioned materials, According to an embodiment, an average diameter of particles of the inorganic filler is, for example, about 0.01 μm to about 5 μm, but is not limited to this range.

According to an embodiment, a thickness of the insulating layer 100 is about 10 μm to about 40 μm. If the thickness of the insulating layer 100 is less than about 10 μm, the insulating layer 100 might not be sufficiently functional as an insulating material, and, if the thickness of the insulating layer 100 is greater than about 40 μm, it would be difficult to produce a thin printed circuit board. According to an embodiment, a thickness of the resin rich layer 110 is about 10 μm or less.

Figure 2:
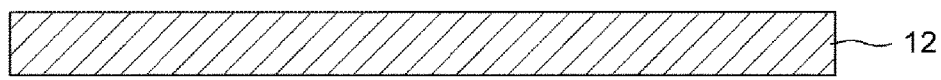
FIGS. 2-4 are cross-sectional views illustrating example processes of a method of manufacturing the insulation film.
Figure 3:
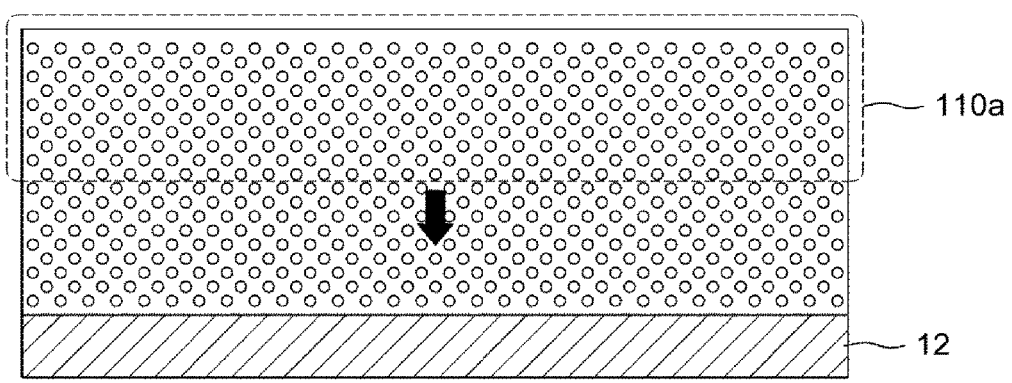
Figure 4:
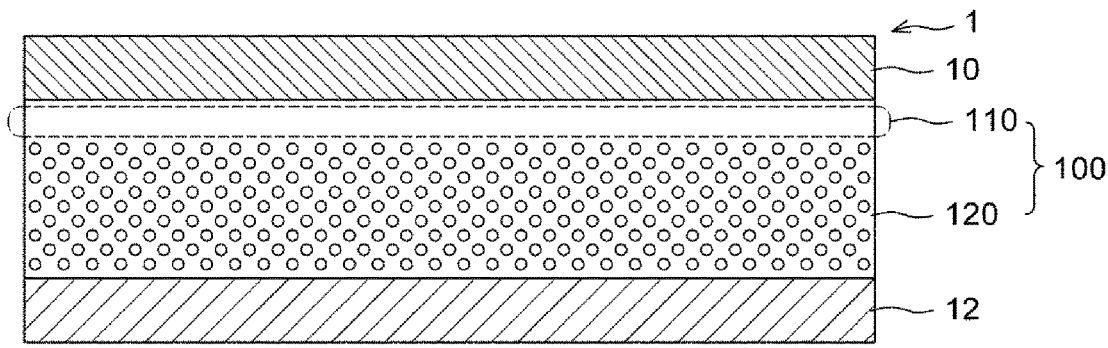

FIGS. 2-4 are cross-sectional views illustrating example processes of a method of manufacturing the insulation film 1, according to an embodiment.

Referring to FIGS. 2-4, a resin composite having an inorganic filler dispersed therein is coated on the lower protective film 12. More specifically, the resin composite is transferred to a slot die head at a front end of casting equipment from a service tank, and the transferred resin composite is discharged on the lower protective film 12, which is moving, through an outlet of the slot die head.

A thickness of the resin rich layer 110 or a ratio of thickness between the resin rich layer 110 and an inorganic filler precipitated layer 120 varies according to a physical property of the resin composite, for example, a viscosity of the resin composite, or a concentration of the inorganic filler. If the viscosity of the resin composite is lowered, a phase stability would will drop. As a result, the inorganic filler is precipitated due to gravity while coating is in progress. Referring to FIG. 3, as the inorganic filler is precipitated, an upper portion 110a of the coated resin composite has a decreased content of inorganic filler, and a lower portion of the coated resin composite has an increased content of inorganic filler. The viscosity of the resin composite may be, for example, about 100 Pa·s or less.

The thickness of the resin rich layer 110 or the ratio of thickness between the resin rich layer 100 and the inorganic filler precipitated layer 120 varies according to a process speed, for example, a discharge speed of the resin composite, or a moving speed of the lower protective film 12.

Referring to FIGS. 3 and 4, the coated resin composite is dried to form the insulating layer 100. Once the resin composite is hardened through a drying process, the inorganic filler is no longer precipitated. Accordingly, the content of the inorganic filler has a concentration gradient that increases continuously from an upper surface of the insulating layer 100 toward a lower surface of the insulating layer 100. As shown in FIG. 4, a volume of the upper portion 110a of the resin composite is decreased due to the drying process, resulting in formation of the resin rich layer 110 at the upper portion of the insulating layer 100 and the formation of the inorganic filler precipitated layer 120 at the bottom portion of the insulating layer 100. Due to the decrease in volume, a density of the resulting insulation film 1 is increased.

Still referring to FIG. 4, the dried insulating layer 100 is laminated with the upper protective film 10 at a lamination roll, thereby forming the insulation film 1.

The resin rich layer 110 increases adhesion with a metal layer, which is to be formed in an upper portion of the resin rich layer 110. A primer layer having a high ratio of resin would require an additional process. On the contrary, in this example, the resin rich layer 110 is formed using a single resin composite, without requiring an additional process such as a process of forming a primer layer to adhere to the metal layer, by simply adjusting the viscosity of the resin composite. As a result, a possible drop in peel strength caused by an increased content of inorganic filler in the insulating layer 100 is avoided when an insulating material for a multilayered substrate is manufactured.

FIGS. 5 to 8 illustrate example processes of manufacturing a printed circuit board 400 (shown in FIG. 8) by laminating the insulation film 1 on a base material 200.

Figure 5:
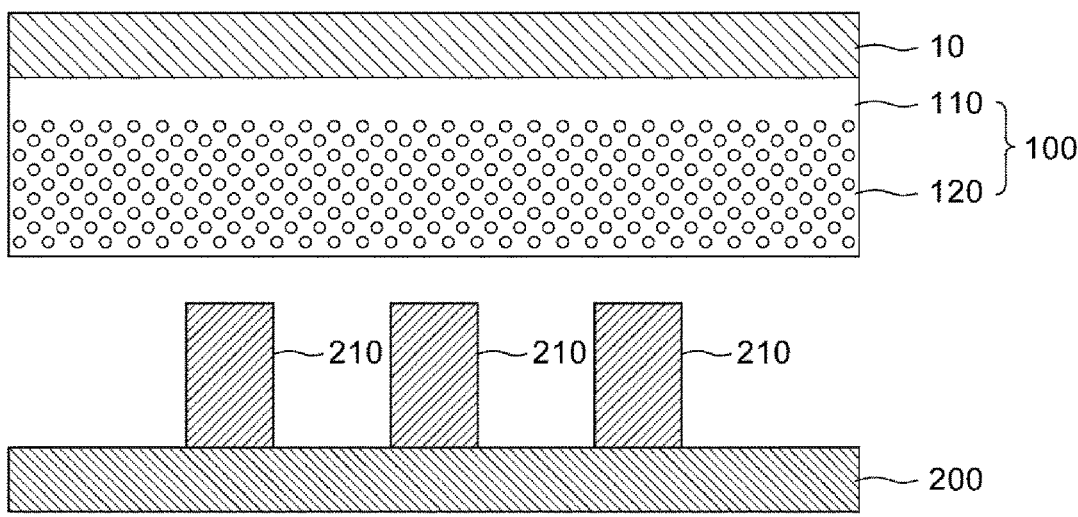
FIGS. 5-8 illustrate example processes of manufacturing a printed circuit board by laminating the insulation film on a base material.

Referring to FIG. 5 to FIG. 8, the insulation film 1 is laminated in such a way that the inorganic filler precipitated layer 120 is in contact with the base material 200 having a circuit pattern 210 formed thereon. For example, the lower protective film 12 is removed from the inorganic filler precipitated layer 120, as shown in FIG. 5, to allow the inorganic filler precipitated layer 120 to be laminated to be in contact with the base material 200. By allowing the inorganic filler precipitated layer 120 to be laminated to be in contact with the base material 200, adhesion between the insulating layer 100 and the base material 200 is improved.

Figure 6:
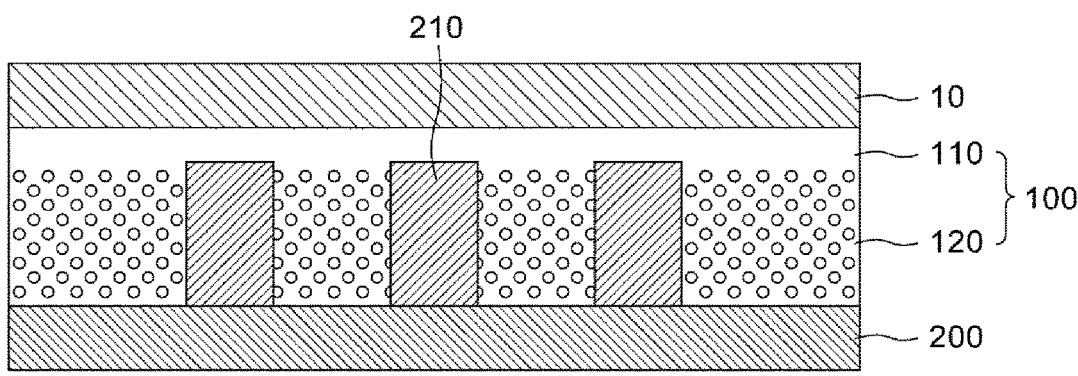
Figure 7:
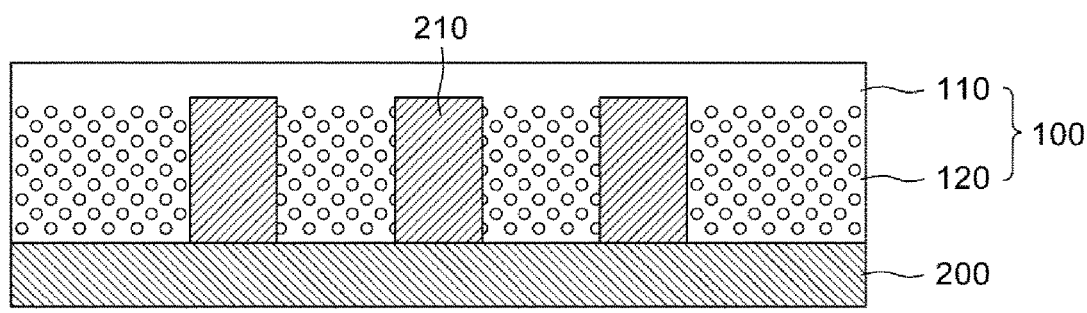

Referring to FIG. 6, after the lower protective film 12 of the insulation film 1 is removed, a high-temperature pressing process, such as vacuum laminating, is carried out. After the high-temperature pressing process is completed, the upper protective film 10 is removed, as shown in FIG. 7.

Figure 8:
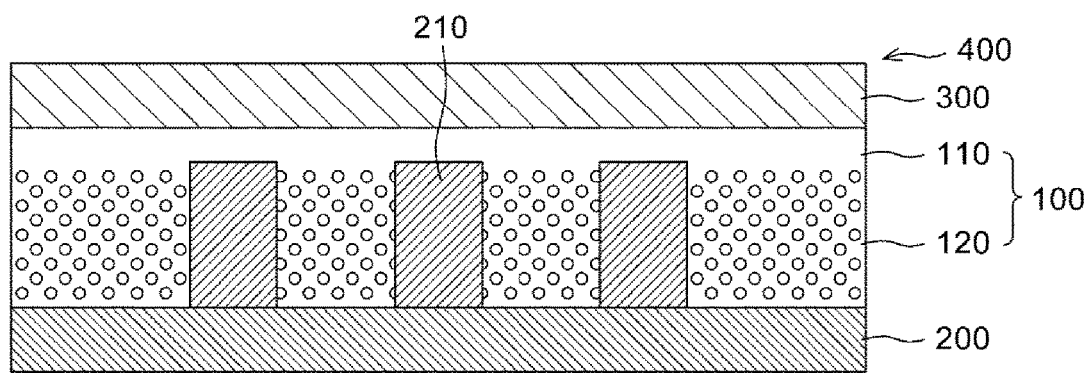

Referring to FIG. 8, a metal layer 300 is formed on the insulating layer 100, from which the upper protective film 10 is removed by, for example, plating. More specifically, the metal layer 300 is formed on the resin rich layer 110. Due to the resin rich layer 110, adhesion between the insulating layer 100 and the metal layer 300 is improved.

As described above, by decreasing the viscosity of the resin composite, it becomes possible to form the insulating layer 100 with an improved adhesion with the metal layer 300, without requiring an additional process such as a process of forming a primer layer to adhere to the metal layer 300. As a result, it is possible to prevent a drop in peel strength that could be caused by an increased content of inorganic filler in the insulating layer. Moreover, it is possible to manufacture the insulation film 1 using a single resin composite.

The lower protective film 12 may be selected to have a relatively smaller adhesive strength than that of the upper protective film 10. Accordingly, it is possible to keep the upper protective film 10 from being peeled off from the insulating layer 100 when the lower protective film 12 is peeled off.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing an insulation film, comprising:
   coating a resin composite on a lower protective film, the resin composite comprising an inorganic filler dispersed therein;
   precipitating the inorganic filler in the coated resin composite toward the lower protective film, by gravity,
   forming an insulating layer by drying the coated resin composite; and
   laminating an upper protective film on the insulating layer.

2. The method as set forth in claim 1, wherein:
   the insulating layer comprises a resin rich layer and an inorganic filler precipitated layer; and
   the insulating layer comprises a concentration gradient of a content of the inorganic filler that increases from the resin rich layer toward the inorganic filler precipitated layer.

3. The method as set forth in claim 2, wherein the concentration gradient of the content of the inorganic filler increases continuously from the resin rich layer toward the inorganic filler precipitated layer.

4. The method as set forth in claim 3, wherein a viscosity of the resin composite is about 100 Pa·s or less.

5. The method of claim 2, wherein a thickness of the insulating layer is about 10 μm to about 40 μm.

6. The method of claim 5, wherein a thickness of the resin rich layer is about 10 μm or less.

7. The method of claim 1, wherein the forming of the insulating layer comprises forming the insulating layer without a primer layer.

8. A method of manufacturing a printed circuit board, comprising:
   coating a resin composite on a lower protective film, the resin composite comprising an inorganic filler dispersed therein;
   precipitating the inorganic filler in the coated resin composite toward the lower protective film, by gravity;
   forming an insulating layer by drying the coated resin composite;
   removing the lower protective film from the insulating layer; and
   laminating the insulating layer, from which the lower protective film is removed, on a base material comprising a circuit pattern.

9. The method as set forth in claim 8, wherein:
   the insulating layer comprises a resin rich layer and an inorganic filler precipitated layer; and
   the insulating layer comprises a concentration gradient of a content of the inorganic filler that increases from the resin rich layer toward the inorganic filler precipitated layer.

10. The method as set forth in claim 9, wherein the concentration gradient of the content of the inorganic filler increases continuously from the resin rich layer toward the inorganic filler precipitated layer.

11. The method as set forth in claim 10, wherein a viscosity of the resin composite is about 100 Pa·s or less.

12. The method as set forth in claim 8, further comprising thermo-compression bonding the insulating layer and the base material.

13. The method as set forth in claim 8, further comprising:
   removing the upper protective film from the insulating layer; and
   forming a metal layer on a surface of the insulating layer from which the upper protective film is removed.

14. The method of claim 13, wherein the forming of the metal layer comprises forming the metal layer without forming a primer layer to adhere the insulating layer to the metal layer.

15. The method as set forth in claim 8, wherein an adhesive strength of the lower protective film is smaller than an adhesive strength of the upper protective film.

* * * * *